United States Patent
Tang et al.

(10) Patent No.: US 11,984,294 B2
(45) Date of Patent: May 14, 2024

(54) EMITTER, ELECTRON GUN IN WHICH SAME IS USED, ELECTRONIC DEVICE IN WHICH SAME IS USED, AND METHOD FOR MANUFACTURING SAME

(71) Applicant: NATIONAL INSTITUTE FOR MATERIALS SCIENCE, Ibaraki (JP)

(72) Inventors: Jie Tang, Ibaraki (JP); Shuai Tang, Ibaraki (JP); Ta-Wei Chiu, Ibaraki (JP); Wataru Hayami, Ibaraki (JP); Luchang Qin, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 17/622,994

(22) PCT Filed: Jun. 29, 2020

(86) PCT No.: PCT/JP2020/025435
§ 371 (c)(1),
(2) Date: Dec. 27, 2021

(87) PCT Pub. No.: WO2021/002305
PCT Pub. Date: Jan. 7, 2021

(65) Prior Publication Data
US 2024/0079198 A1    Mar. 7, 2024

(30) Foreign Application Priority Data
Jul. 2, 2019    (JP) .................. 2019-123570

(51) Int. Cl.
*H01J 37/065* (2006.01)
(52) U.S. Cl.
CPC ... *H01J 37/065* (2013.01); *H01J 2237/06316* (2013.01); *H01J 2237/06341* (2013.01)

(58) Field of Classification Search
CPC ........... H01J 37/065; H01J 2237/06316; H01J 2237/06341
See application file for complete search history.

(56) References Cited

U.S. PATENT DOCUMENTS

| 10,794,371 | B2 * | 10/2020 | Vancil .................. F03H 1/0037 |
| 2015/0002009 | A1 | 1/2015 | Zhang et al. |

(Continued)

FOREIGN PATENT DOCUMENTS

| WO | 2014/007121 | 1/2014 |
| WO | 2016/140177 | 9/2016 |

(Continued)

OTHER PUBLICATIONS

Extended European Search Report dated May 2, 2023 in corresponding European Patent Application No. 20834956.3.

(Continued)

*Primary Examiner* — Donald L Raleigh
(74) *Attorney, Agent, or Firm* — Wenderoth, Lind & Ponack, L.L.P.

(57) ABSTRACT

The present invention provides an emitter made of a hafnium carbide (HfC) single crystal that stably emits electrons with high efficiency, a method for manufacturing the emitter, and an electron gun and an electronic device using the emitter. An emitter according to an embodiment of the present invention is an emitter including a nanowire, in which the nanowire is made of the hafnium carbide (HfC) single crystal, at least an end of the nanowire through which electrons are to be emitted is coated with hafnium oxycarbide ($HfC_{1-x}O_x$: $0<x\leq0.5$), and a field electron emission pattern of the end obtained by a field emission microscope (FEM) is a single spot.

20 Claims, 11 Drawing Sheets

(56) References Cited

U.S. PATENT DOCUMENTS

| | | |
|---|---|---|
| 2018/0019091 A1 | 1/2018 | Tang et al. |
| 2019/0066966 A1 | 2/2019 | Kusunoki et al. |
| 2020/0388458 A1 | 12/2020 | Tang et al. |

FOREIGN PATENT DOCUMENTS

| | | |
|---|---|---|
| WO | 2017/149862 | 9/2017 |
| WO | 2019/107113 | 6/2019 |

OTHER PUBLICATIONS

Jinshi Yuan et al., "Field emission from single-crystalline HfC nanowires", Applied Physics Letters, vol. 100, 113111-1-113111-3, 2012.
Notice of Reasons for Refusal dated Aug. 9, 2022 in corresponding Japanese Patent Application No. 2021-530001, with English-language translation.
International Search Report dated Sep. 15, 2020 in International (PCT) Application No. PCT/JP2020/025435.
Communication pursuant to Article 94(3) EPC dated Nov. 3, 2023 in corresponding European Patent Application No. 20834956.3.

\* cited by examiner

Fig. 3

S310 | Nanowire made of the hafnium carbide (HfC) single crystal is subjected to field evaporation in atmospheric gas, the end of the nanowire, through which electrons are to be emitted, is formed to be a tapered shape, and the radius of curvature r of the tip of the end is set to a value of 50% or less of the length d of the nanowire in the lateral direction.

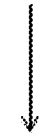

S320 | Nanowire is heated in an oxygen-containing atmosphere.

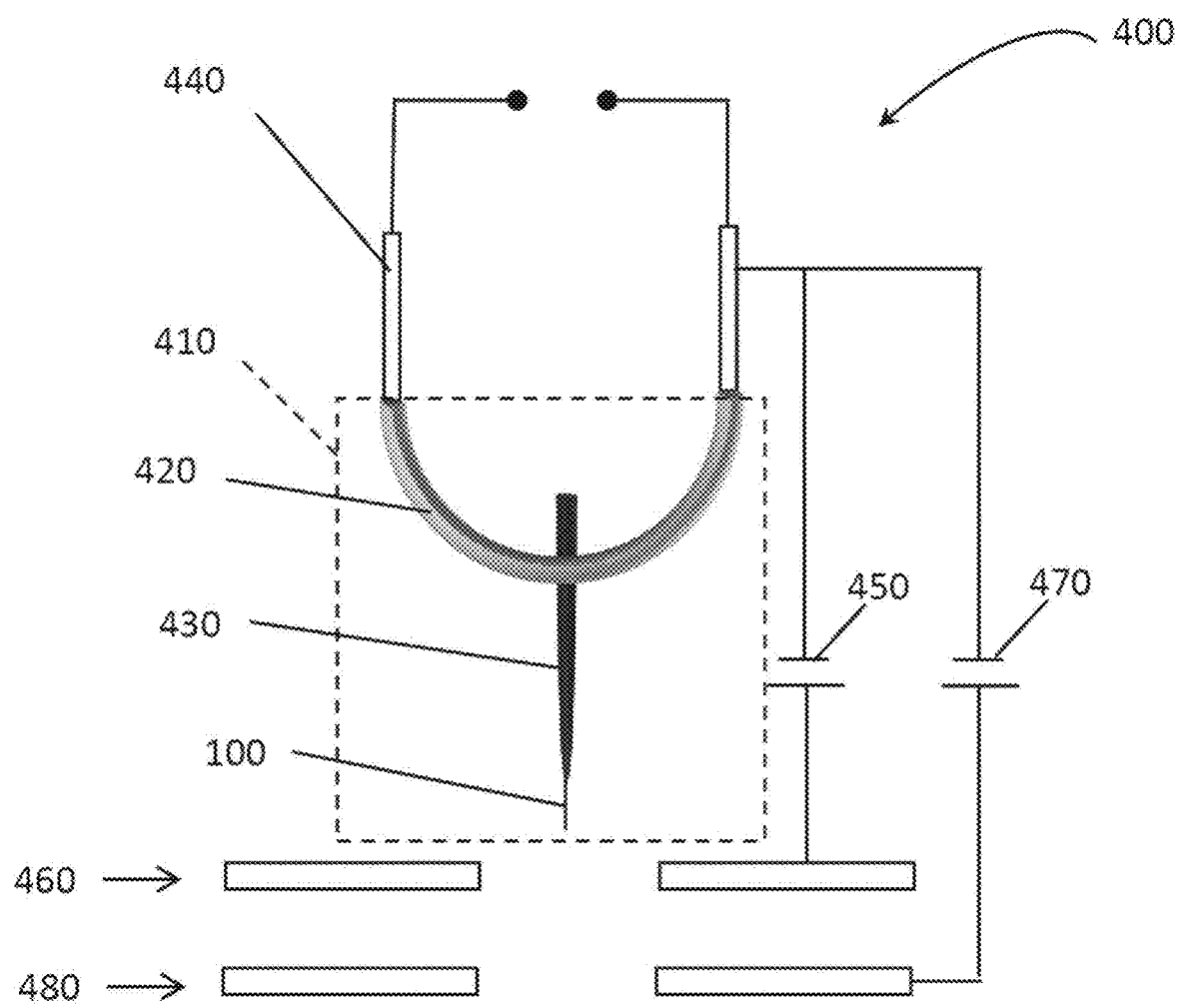

Fig. 8
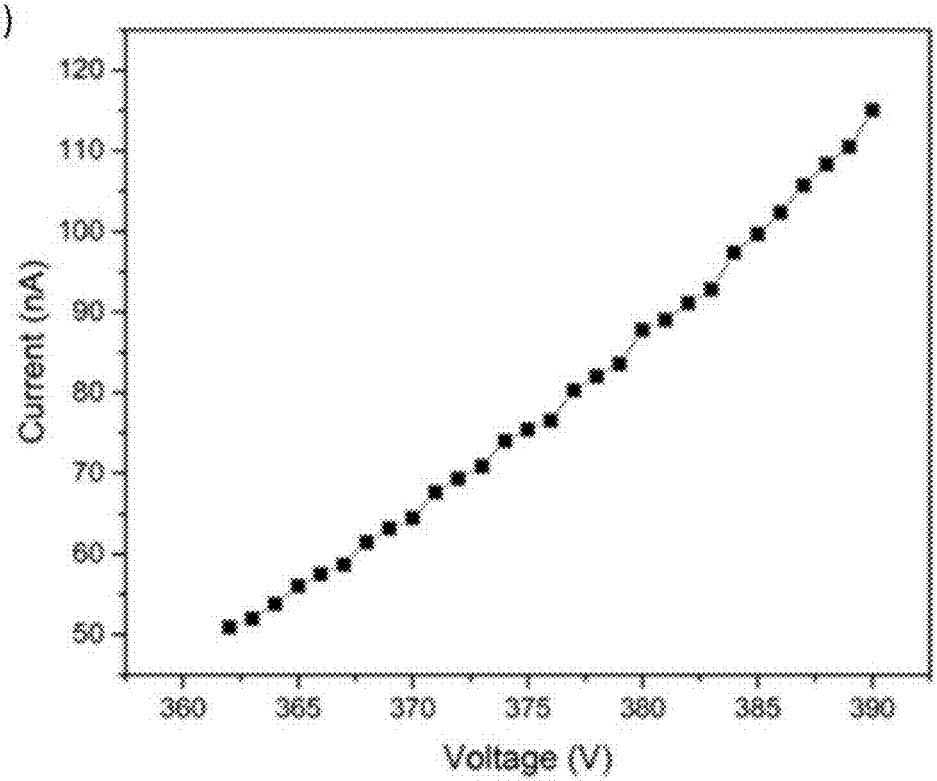
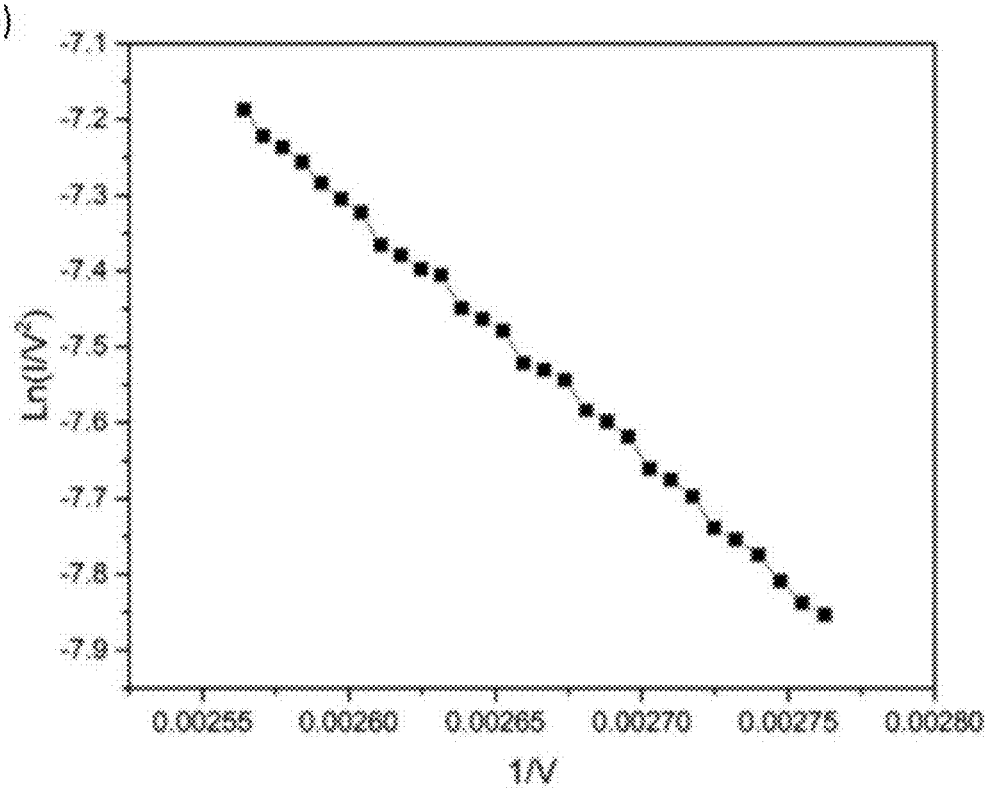

Fig. 10
(a)
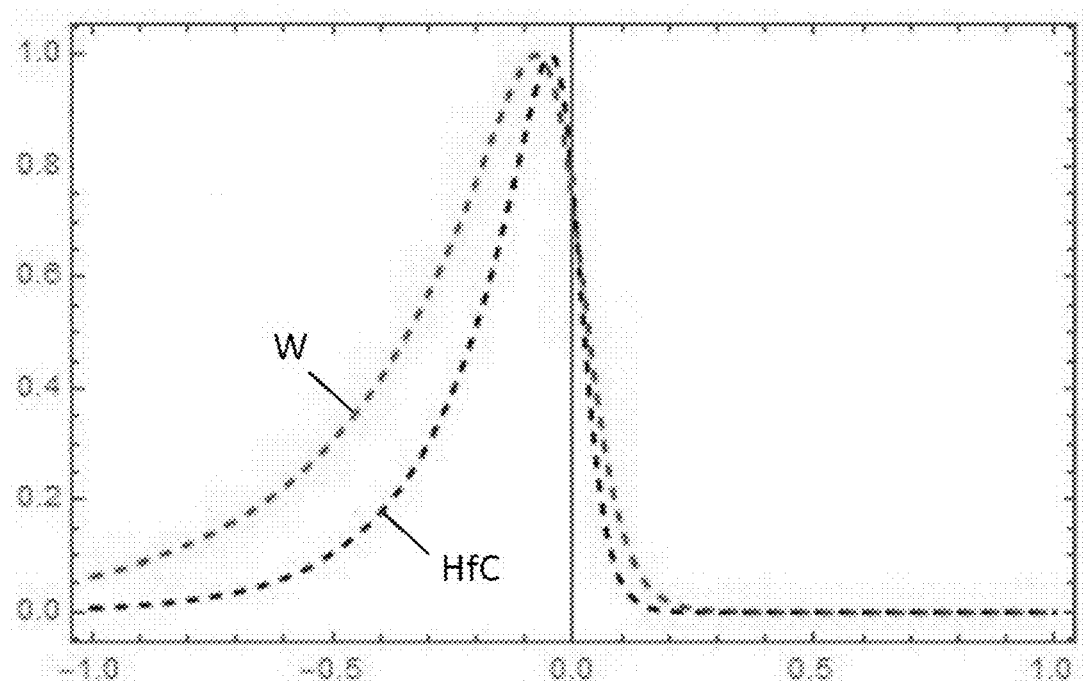
(b)
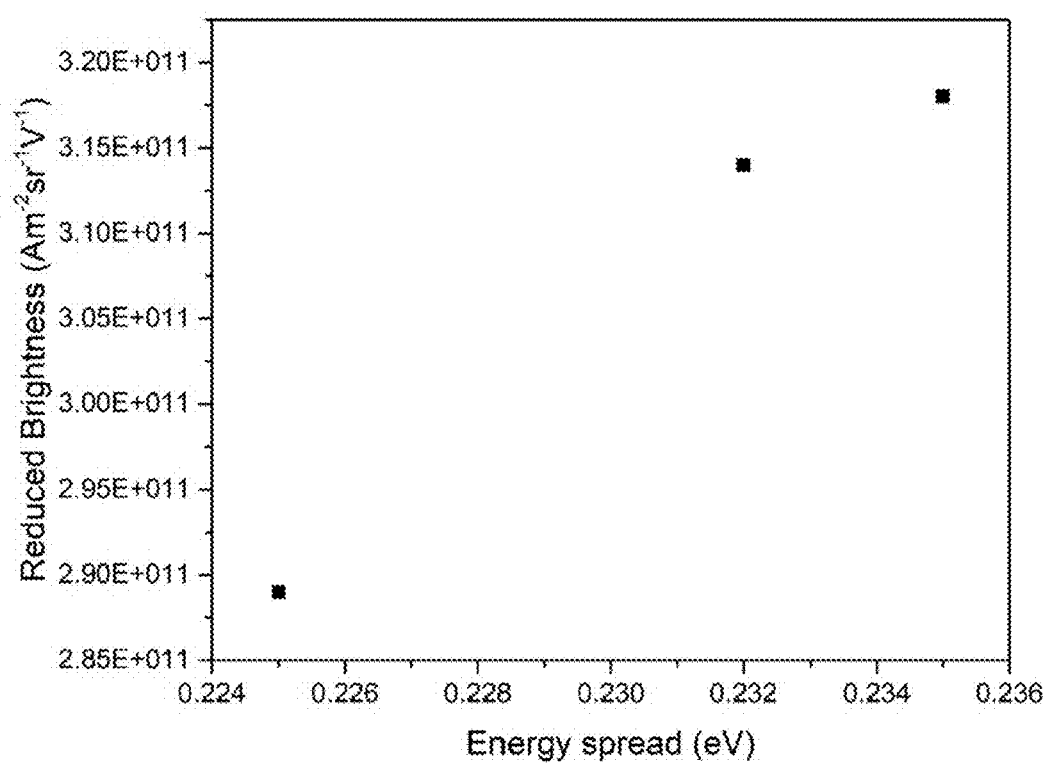

Fig. 13
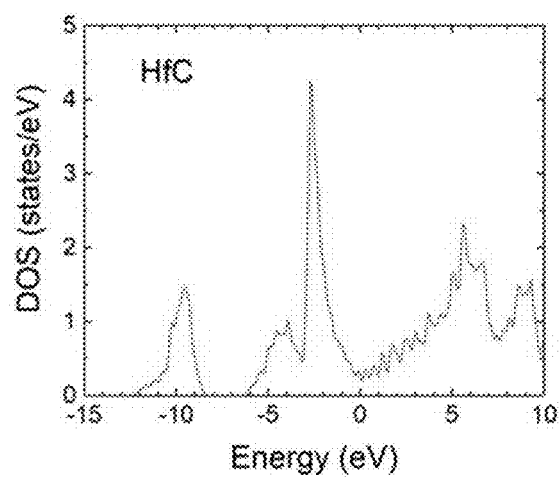
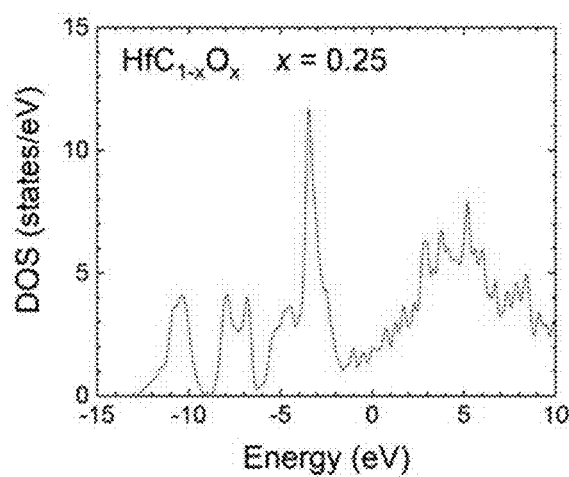
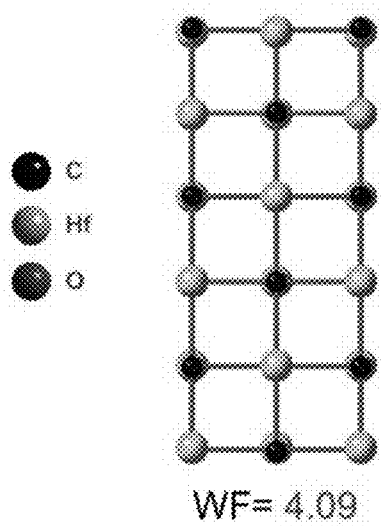
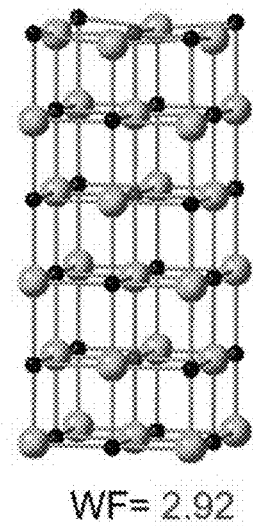
WF= 4.09
WF= 2.92

EMITTER, ELECTRON GUN IN WHICH SAME IS USED, ELECTRONIC DEVICE IN WHICH SAME IS USED, AND METHOD FOR MANUFACTURING SAME

TECHNICAL FIELD

The present invention relates to an emitter, an electron gun using the emitter, an electronic device using the emitter, and a method for manufacturing the emitter.

BACKGROUND ART

Various improvements have been made to electron guns used in electron microscopes in order to obtain a high-resolution and high-brightness observation image. Examples of an electron source using such an electron gun include a field emission-type electron source, a Schottky-type electron source, and the like. These are characterized in that the tip of an emitter used in an electron gun is sharpened to generate an electric field concentrating effect at the tip and to emit more electrons through the tip.

In recent years, an emitter composed of a hafnium carbide single crystal nanowire coated with hafnium oxide has been developed (for example, see Patent Literature 1). In addition, an emitter composed of a hafnium carbide single crystal nanowire has been developed, in which a longitudinal direction of the nanowire corresponds to a <100> crystal direction of the hafnium carbide single crystal, an end of the nanowire, through which electrons are to be emitted, has a (200) plane and a {311} plane(s) of the hafnium carbide single crystal, the (200) is centered, and the {311} plane(s) surrounds the (200) plane (for example, see Patent Literature 2).

However, there is room for further improvement regarding stability of electron emission characteristics (electron emission is also referred to as "field electron emission" or "field emission") from the hafnium carbide nanowire emitters described in Patent Literature 1 and Patent Literature 2.

CITATION LIST

Patent Literature

Patent Literature 1: WO 2016/140177 A
Patent Literature 2: WO 2019/107113 A

SUMMARY OF INVENTION

Technical Problem

An object of the present invention is to provide an emitter made of a hafnium carbide (HfC) single crystal that stably emits electrons with high efficiency, a method for manufacturing the emitter, and an electron gun and an electronic device using the emitter.

Solution to Problem

As a result of intensive studies to achieve the above object, the inventors of the present application have found for the first time an emitter comprising a nanowire, in which the nanowire is made of a hafnium carbide (HfC) single crystal, and at least an end of the nanowire, through which electrons are to be emitted, is coated with hafnium oxycarbide ($HfC_{1-x}O_x$: $0<x\leq0.5$). Further, the inventors of the present application have also found the following. That is, in this emitter, the work function of the end of the nanowire, through which electrons are to be emitted, is reduced than that of the conventional emitter made of the hafnium carbide single crystal (specifically, hafnium carbide nanowire emitters described in Patent Literature 1 and Patent Literature 2), and therefore more stable electron emission is possible as compared with the conventional emitter made of the hafnium carbide single crystal. Based on the above, the inventors have completed the present invention.

An emitter according to the present invention includes a nanowire. The nanowire is made of a hafnium carbide (HfC) single crystal, at least an end of the nanowire, through which electrons are to be emitted, is coated with hafnium oxycarbide ($HfC_{1-x}O_x$: $0<x\leq0.5$), and a field electron emission pattern of the end obtained by a field emission microscope (FEM) is a single spot, thereby solving the above problems.

The end of the nanowire, through which electrons are to be emitted, may have a tapered shape, and a radius of curvature r of a tip of the end may be a value of 50% or less of a length d of the nanowire in a lateral direction.

A thickness of the hafnium oxycarbide may be in a range of 1 nm or more and 20 nm or less.

The thickness of the hafnium oxycarbide may be in a range of 1 nm or more and 10 nm or less.

The thickness of the hafnium oxycarbide may be in a range of 1 nm or more and 5 nm or less.

A longitudinal direction of the nanowire may correspond to a <100>, <110>, or <111> crystal direction of the hafnium carbide single crystal.

The longitudinal direction of the nanowire may correspond to the <100> crystal direction of the hafnium carbide single crystal, and the end may have at least {111} and {110} planes.

A length d of the nanowire in a lateral direction is in a range of 1 nm or more and 150 nm or less, and a length L of the nanowire in a longitudinal direction is in a range of 500 nm or more and 30 μm or less.

An electron gun including at least an emitter according to the present invention, in which the emitter is the emitter described above, thereby solving the above problems.

The emitter may further include a needle and a filament, and the nanowire may be attached to the filament via the needle made of an element selected from the group consisting of tungsten (W), tantalum (Ta), platinum (Pt), rhenium (Re), and carbon (C).

The electron gun may be a cold cathode field emission electron gun or a Schottky electron gun.

An electronic device including an electron gun according to the present invention, in which the electron gun is the electron gun described above, and the electronic device is selected from the group consisting of a scanning electron microscope, a transmission electron microscope, a scanning transmission electron microscope, an Auger electron spectrometer, an electron energy loss spectrometer, and an energy dispersive electron spectrometer, thereby solving the above problem.

A method for manufacturing the emitter described above according to the present invention includes subjecting a nanowire made of a hafnium carbide single crystal to field evaporation in atmospheric gas, forming an end of the nanowire, through which electrons are to be emitted, into a tapered shape, and setting a radius of curvature r of a tip of the end to a value of 50% or less of a length d of the nanowire in a lateral direction, and heating the nanowire in an oxygen-containing atmosphere. In the method, the length d of the nanowire in the lateral direction is 150 nm or less, and in the heating the nanowire, an oxygen partial pressure is in a range of $1\times10^{-8}$ Pa or more and $1\times10^{-5}$ Pa or less, heating temperature is in a range of 400 K or more and 1200 K or less, and heating time is in a range of 5 seconds or more and 600 seconds or less, thereby solving the above problem.

The subjecting the nanowire to field evaporation may be performed in a range of 12 hours or more and 50 hours or less.

In the heating the nanowire, the oxygen partial pressure may be in a range of $5\times10^{-7}$ Pa or more and $7\times10^{-6}$ Pa or less.

In the heating the nanowire, the heating temperature may be in a range of 900 K or more and 1100 K or less.

In the heating the nanowire, the heating time may be in a range of 5 seconds or more and 350 seconds or less.

In the subjecting the nanowire to field evaporation, the radius of curvature r may be in a range of 30% or more and 40% or less of the length d of the nanowire in the lateral direction.

In the subjecting the nanowire to field evaporation, the radius of curvature r may be in a range of 25 nm or more and 50 nm or less.

In the heating the nanowire, the heating time may be in a range of 10 seconds or more and 300 seconds or less.

Advantageous Effects of Invention

In the emitter including the nanowire made of the hafnium carbide (HfC) single crystal according to the present invention, at least the end of the nanowire, through which electrons are to be emitted, is coated with hafnium oxycarbide (HfC$_{1-x}$O$_x$: $0<x\leq0.5$), and thus the work function of the end of the nanowire (i.e., the hafnium carbide single crystal), through which electrons are to be emitted, is reduced by the coated hafnium oxycarbide, and electrons are easily emitted. As a result, the emitter according to the present invention has a single-spot field electron emission pattern at the end, which is obtained by using a field emission microscope (FEM), and is excellent in electron emission characteristics. In addition, since the dangling bond on the surface of the end of the hafnium carbide single crystal, through which electrons are to be emitted, is eliminated by the coated hafnium oxycarbide, the emitter according to the present invention can stably emit electrons for a long time.

BRIEF DESCRIPTION OF DRAWINGS

FIG. 3 is a flowchart showing a method for manufacturing the emitter according to Embodiment 1.

FIG. 4 is a schematic view showing an electron gun according to Embodiment 2.

FIG. 8 is a group of graphs indicating field emission characteristics of the emitter according to Example 1: (a) a graph of a field emission current obtained by changing an extraction voltage from 362 V to 390 V in increments of 1 V (a graph indicating V-I characteristics), and (b) a Fowler-Nordheim (F-N) plot obtained from the result of (a).

FIG. 10(a) is a graph indicating an energy spread of electrons emitted from the emitter according to Example 1 (in the graph, denoted by "HfC") and an energy spread of electrons emitted from an emitter using a commercially available tungsten chip having a <310> crystal direction (in the drawing, denoted by "W"), and FIG. 10(b) is a diagram showing a relationship between energy spreads and reduced brightness obtained at three different current values for the emitter according to Example 1.

FIG. 13 is a group of graphs and diagrams showing results of calculation of electronic states of an HfC single crystal and hafnium oxycarbide (HfC$_{1-x}$O$_x$: x=0.25) on the basis of the density functional theory (DFT).

DESCRIPTION OF EMBODIMENTS

Figure 1:
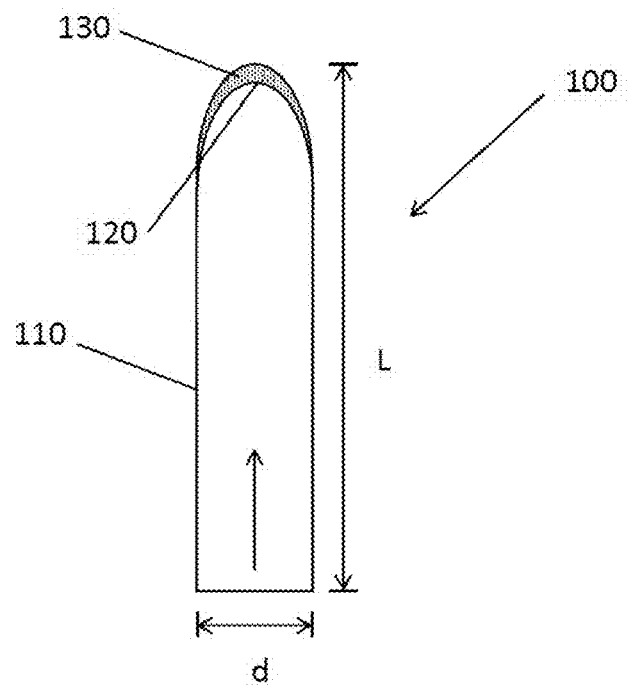
FIG. 1 is a schematic view of an emitter according to Embodiment 1.

Hereinafter, embodiments according to the present invention will be described with reference to the drawings. Note that the same reference numerals will be given to the same elements, and a description thereof will not be repeated.

Embodiment 1

In Embodiment 1, an emitter according to the present invention and a method for manufacturing the emitter will be described.

FIG. 1 is a schematic view of the emitter according to Embodiment 1.

Figure 2:
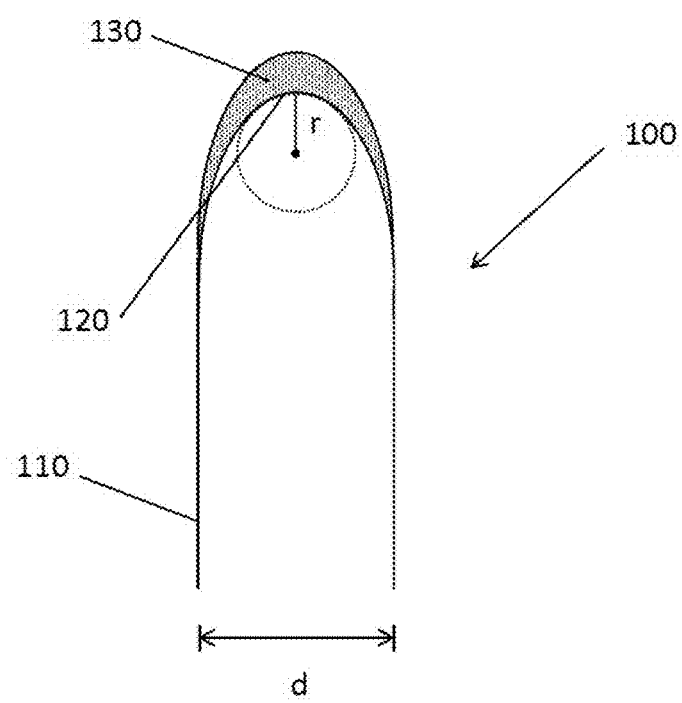
FIG. 2 is a partially enlarged view of the emitter shown in FIG. 1.

FIG. 2 is a partially enlarged view of the emitter shown in FIG. 1.

As shown in FIG. 1, the emitter according to the present embodiment includes a nanowire 100, and the nanowire 100 is made of a hafnium carbide single crystal 110 (hereinafter, hafnium carbide is referred to as HfC). At least an end 120 of the nanowire 100, through which electrons are to be emitted (hereinafter, this end is also simply referred to as the end), is coated with hafnium oxycarbide 130 (HfC$_{1-x}$O$_x$: $0<x\leq0.5$). Therefore, in the emitter according to the present embodiment, the work function of the end 120 of the nanowire 100 (i.e., the HfC single crystal 110), through which electrons are to be emitted, is reduced by the coated hafnium oxycarbide 130, and electrons can be easily emitted. As a result, the emitter according to the present embodiment has a field electron emission pattern of a single spot at the end, which is obtained by a field emission microscope (FEM), and is excellent in electron emission characteristics. In addition, since the dangling bond on the surface of the end 120 of the HfC single crystal 110, through which electrons are to be emitted, is eliminated by the hafnium oxycarbide 130, the emitter according to the present embodiment can stably emit electrons for a long time.

In the present description, the nanowire is intended to have a wire shape on the order of nanometers. In the present embodiment, the section of the nanowire 100 is preferably circular.

Preferably, the longitudinal direction (the direction indicated by the upward arrow in FIG. 1) of the nanowire 100 corresponds to a <100>, <110>, or <111> crystal direction of the HfC single crystal 110. In this way, a favorable single crystal with few cracks, kinks, and the like can be secured as the HfC single crystal 110 in the nanowire 100.

For example, in a case where the longitudinal direction of the nanowire 100 corresponds to the <100> crystal direction of the HfC single crystal 110, not only the HfC single crystal 110 that is favorable with few cracks, kinks, and the like can be obtained, but also electrons can be efficiently emitted since the crystal plane of the end 120 through which electrons are to be emitted includes a plane having a low work function, such as {111} or {110}.

For example, in a case where the longitudinal direction of the nanowire 100 corresponds to the <110> crystal direction of the HfC single crystal 110, electrons can be efficiently emitted since the crystal plane of the end 120 through which electrons are to be emitted includes at least a plane having a low work function, such as {111}.

For example, in a case where the longitudinal direction of the nanowire 100 corresponds to the <111> crystal direction of the HfC single crystal 110, electrons can be efficiently emitted since the crystal plane of the end 120 through which electrons are to be emitted includes a plane having a low work function, such as {111}.

Most preferably, the longitudinal direction of the nanowire 100 corresponds to the <100> crystal direction of the HfC single crystal 110 from the viewpoint of ease of manufacturing and processing, quality of a crystal, and the like.

Since the HfC single crystal is a cubic, in the present description, in a case where <100>, <110>, and <111> are described as crystal directions of the HfC single crystal 110, it should be noted that each of the crystal directions includes all crystal directions which are equivalent to the crystal direction. Similarly, in a case where {111}, {110}, and the like are described as crystal planes of the HfC single crystal 110, it should be noted that each of the crystal planes includes crystal planes with equivalent symmetry.

Preferably, a length d of the nanowire 100 in the lateral direction (i.e., a diameter of the nanowire 100) is in the range of 1 nm or more and 150 nm or less, and the length L in the longitudinal direction is in the range of 500 nm or more and 30 µm or less. With such a size, electric field concentration on the end 120 through which electrons are to be emitted can be effectively generated, thereby allowing the end 120 to emit more electrons.

More preferably, the length d of the nanowire 100 in the lateral direction is in the range of 10 nm or more and 100 nm or less, and the length L in the longitudinal direction is in the range of 5 µm or more and 30 µm or less. For example, in a case where the nanowire 100 is manufactured using a chemical vapor deposition method (CVD) described later, the nanowire 100 having the above-described range and made of an HfC single crystal having good quality without cracks, kinks, or the like can be easily provided.

Figure 6:
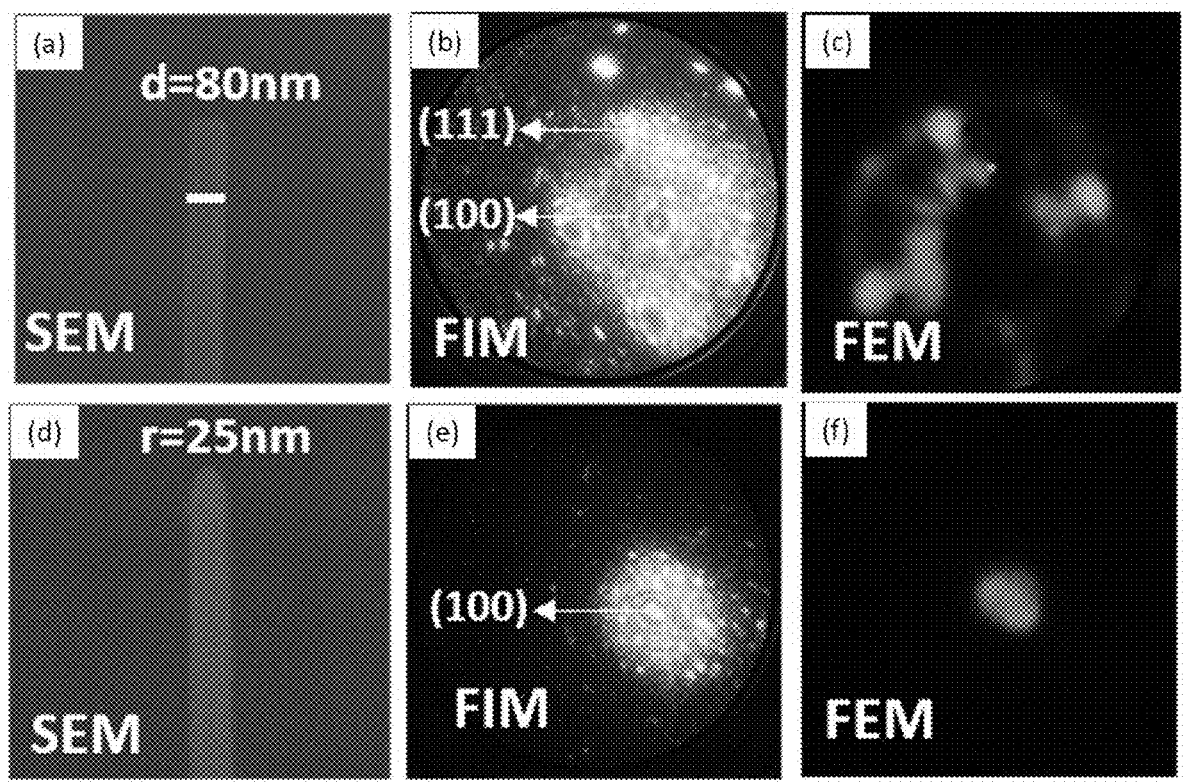
FIG. 6 shows SEM images, FIM images, and FEM images of an end of the nanowire before and after field evaporation according to Example 1: (a) an SEM image before field evaporation, (b) an FIM image before field evaporation, (c) an FEM image before field evaporation, (d) an SEM image after field evaporation, (e) an FIM image after field evaporation, and (f) an FEM image after field evaporation.
Figure 7:
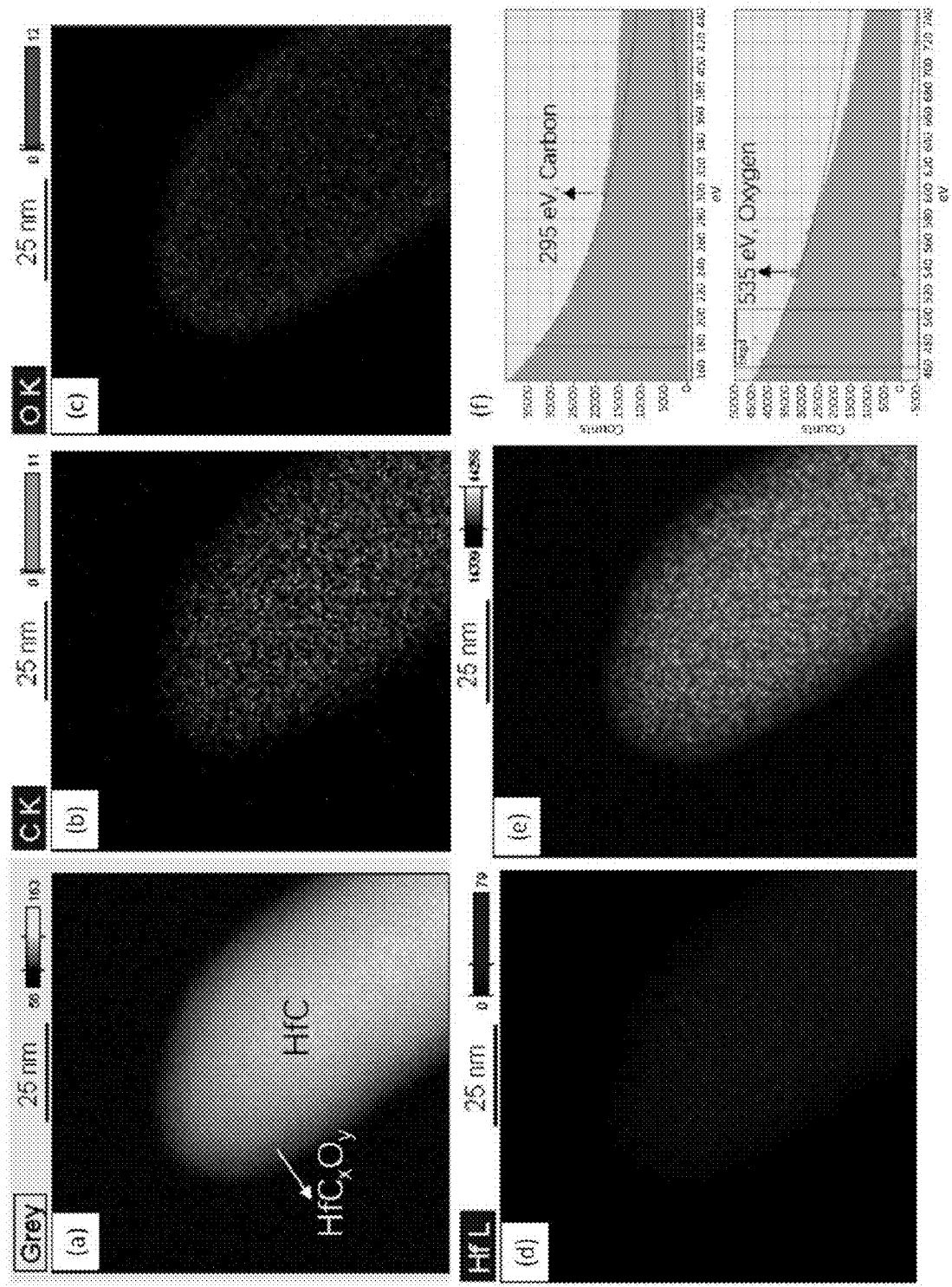
FIG. 7 is a group of images and graphs showing the results of analyzing the state of the end of the nanowire by a TEM after heating according to Example 1: (a) a STEM image, (b) to (e) images showing the results of mapping using STEM-EDS, and (f) graphs showing the results of STEM-EELS.

Preferably, the end 120 of the nanowire 100, through which electrons are to be emitted, has a tapered shape, and a radius of curvature r of a tip of the end 120 is a value of 50% or less of the length d of the nanowire 100 in the lateral direction (FIG. 2). In this way, the emitter according to the present embodiment can emit electrons more efficiently, and more stably for a long time. Working and processing for forming the end 120 into a tapered shape can be performed by field evaporation described later, for example. Note that the radius of curvature r of the tip of the end 120 of the nanowire 100, through which electrons are to be emitted, is calculated from the SEM image of the end 120. In addition, the tapered shape of the end 120 can be confirmed from the SEM image, the STEM image, the FIM image, and the FEM image of the end 120. Specifically, when the end 120 has a tapered shape, an SEM image or a STEM image as schematically shown in FIG. 2 can be obtained in plan view of the nanowire 100 from the longitudinal direction. In the FIM image, bright portions are concentrated on the tip of the end 120, and in the FEM image, the field electron emission pattern is observed as a single spot (see (d), (e), (f) of FIG. 6, and (a) of FIG. 7, described later).

More preferably, the radius of curvature r of the tip of the end 120 of the nanowire 100, through which electrons are to be emitted, is in the range of 20% or more and 45% or less of the length d of the nanowire 100 in the lateral direction. Further, the radius of curvature r of the tip of the end 120 of the nanowire 100, through which electrons are to be emitted, is still more preferably in the range of 30% or more and 40% or less of the length d of the nanowire 100 in the lateral direction. When the radius of curvature r of the tip of the end 120 and the length d of the nanowire 100 in the lateral direction satisfy the above conditions, an emitter having a more excellent effect of the present invention can be obtained.

The value of the radius of curvature r of the tip of the end 120 of the nanowire 100, through which electrons are to be emitted, is not particularly limited, but is, for example, preferably in the range of 0.2 nm or more and 75 nm or less, more preferably in the range of 0.5 nm or more and 67.5 nm or less, still more preferably in the range of 2 nm or more and 50 nm or less, and yet more preferably in the range of 5 nm or more and 45 nm or less. In addition, the value of the radius of curvature r of the tip of the end 120 of the nanowire 100, through which electrons are to be emitted, can be appropriately adjusted in accordance with the use of the emitter or the like. Specifically, in a case where the emitter according to the present invention is used for an electron gun for example, the radius of curvature r of the tip of the end 120 of the nanowire 100, through which electrons are to be emitted, may be in the range of 5 nm or more and 50 nm or less, in the range of 10 nm or more and 45 nm or less, in the range of 15 nm or more and 40 nm or less, or in the range of 20 nm or more and 35 nm or less, from a practical point of view.

Preferably, the thickness of the hafnium oxycarbide 130 is in the range of 1 nm or more and 20 nm or less. When the thickness of the hafnium oxycarbide 130 is less than 1 nm, the work function of the end 120 through which electrons are to be emitted may not be reduced, and the electron emission characteristics may be impaired. When the thickness of the hafnium oxycarbide 130 exceeds 20 nm, electrons derived from the HfC single crystal 110 cannot be physically emitted due to the thickness of the hafnium oxycarbide 130 (emission of electrons is hindered by the hafnium oxycarbide 130), and electron emission characteristics may be deteriorated.

More preferably, the thickness of the hafnium oxycarbide 130 is in the range of 1 nm or more and 10 nm or less. When the thickness of the hafnium oxycarbide 130 is in this range, the work function of the end 120 through which electrons are to be emitted can be reduced, and favorable electron emission characteristics can be obtained. Still more preferably, the thickness of the hafnium oxycarbide 130 is in the range of 1 nm or more and 5 nm or less. When the thickness of the hafnium oxycarbide 130 is in this range, the work function of the end 120 through which electrons are to be emitted can be reduced, and favorable electron emission characteristics are reliably obtained.

Note that the nanowire 100 is shown as the emitter itself in FIGS. 1 and 2, but the present invention is not limited thereto. For example, the emitter may be the nanowire 100 itself, or may have a configuration in which the nanowire 100 is attached to and integrated with the needle, or a configuration in which such integrated component is further attached to a filament.

In addition, FIGS. 1 and 2 show a view in which a part of the nanowire 100 including the end 120 through which electrons are to be emitted is coated with the hafnium oxycarbide 130, but the same effect can be exerted in a case where a wider part or the whole of the HfC single crystal 110 including the end 120 is coated with the hafnium oxycarbide 130.

Furthermore, a portion of the nanowire 100 (HfC single crystal 110), which is not coated with the hafnium oxycarbide 130, may have an oxide coating (not shown) formed by exposure to a normal air atmosphere. When such an oxide coating is present, the portion may be coated with hafnium oxide ($HfO_2$).

Next, a method for manufacturing the emitter according to the present embodiment will be described.

FIG. 3 is a flowchart showing a method for manufacturing the emitter according to the present embodiment.

Step S310: The nanowire 100 made of the hafnium carbide (HfC) single crystal 110 is subjected to field evaporation in atmospheric gas, the end 120 of the nanowire 100, through which electrons are to be emitted, is formed to be a tapered shape, and the radius of curvature r of the tip of the end 120 is set to a value of 50% or less of the length d of the nanowire 100 in the lateral direction.

The method for manufacturing the nanowire 100 made of the HfC single crystal 110 is not particularly limited, but the nanowire 100 may be manufactured by a method selected from the group consisting of chemical vapor deposition methods (CVD) using a metal catalyst; physical vapor deposition methods such as vapor-liquid-solid (VLS) methods, sputtering methods, and laser ablation methods; and templating methods.

In step S310, atoms are evaporated from the end 120 of the HfC single crystal 110, through which electrons are to be emitted, by field evaporation. Since contaminants and impurities adhering to the evaporated atoms are also removed, the end becomes clean. Furthermore, such evaporation of atoms exposes the crystal plane of the end, resulting in the formation of the end 120 having a tapered shape.

The field evaporation step is performed by applying a high electric field in the range of 1 V/nm or more and 10 V/nm or less to one end of the nanowire 100. In this way, one end of the nanowire 100 is cleaned, and the end 120 having a tapered shape in which the crystal plane is exposed can be obtained. Note that the electric field intensity to be applied is appropriately adjusted within the above range mainly in consideration of the length d of the nanowire 100 in the lateral direction, and is representatively in the range of 1500 V or more and 5000 V or less.

Preferably, the field evaporation step is performed in the range of 2 hours or more and 50 hours or less. In this way, the radius of curvature r of the tip of the end 120 of the nanowire 100, through which electrons are to be emitted, can be reliably set to a value of 50% or less of the length d of the nanowire 100 in the lateral direction. In addition, this makes it possible to reduce variations in the crystal direction at the end 120 of the HfC single crystal 110, and electrons are more efficiently emitted. Note that the time of the field evaporation step is appropriately adjusted within the above range mainly in consideration of the length d of the nanowire 100 in the lateral direction and the state of the surface of the nanowire 100 (presence or absence of an oxide coating, or the like).

Although in a case where the time of the field evaporation step exceeds 50 hours, a structure in which the end 120 of the nanowire 100, through which electrons are to be emitted, is coated with hafnium oxycarbide can be obtained by appropriately adjusting the conditions of the heating step described later. However, taking a long time for the field evaporation step is not desirable in terms of manufacturing efficiency of the emitter. Therefore, the length d of the nanowire 100 in the lateral direction is preferably 150 nm or less, and more preferably 100 nm or less. As an example, a case of the nanowire used in the examples described later (d=80 nm) is hereby assumed. When the time of the field evaporation step is 12 hours or more, the radius of curvature r of the tip of the end of the nanowire, through which electrons are to be emitted, can be set to a value of 50% or less of the length d in the lateral direction. When the time is 13 hours or more, such value setting can be more reliably ensured. Further in this case, since the radius of curvature r of the tip of the end of the nanowire becomes 40 nm or less due to the field evaporation step, the emitter obtained through the heating step described later can emit electrons efficiently, and can emit electrons stably for a long time. This can be confirmed by observing the field electron emission pattern as a single spot in the FEM image of the end of the nanowire. That is, the radius of curvature r of the tip of the end 120 of the nanowire 100, through which electrons are to be emitted, is preferably 75 nm or less, and more preferably 50 nm or less. On the other hand, if the length d of the nanowire in the lateral direction exceeds 150 nm, a long time is required for the field evaporation step, and the radius of curvature r of the tip of the end of the nanowire may exceed 75 nm. In such a case, since the field electron emission pattern may be observed as a plurality of spots in the FEM image of the end of the nanowire, the performance of the emitter may be poor.

Preferably, in the field evaporation step, the radius of curvature r of the tip of the end 120 of the nanowire 100, through which electrons are to be emitted, is set in the range of 20% or more and 45% or less of the length d of the nanowire 100 in the lateral direction. Further, in the field evaporation step, the radius of curvature r of the tip of the end 120 of the nanowire 100, through which electrons are to be emitted, is more preferably in the range of 30% or more and 40% or less of the length d of the nanowire 100 in the lateral direction. When the radius of curvature r of the tip of the end 120 and the length d of the nanowire 100 in the lateral direction satisfy the above conditions, the generation of hafnium oxycarbide in the heating step described later is easily promoted.

In addition, in the field evaporation step, the radius of curvature r of the tip of the end 120 of the nanowire 100, through which electrons are to be emitted, is preferably in the range of 25 nm or more and 50 nm or less. When the radius of curvature r of the tip of the end 120 satisfies this condition, the generation of hafnium oxycarbide in the heating step described later is easily promoted.

Step S320: The nanowire 100 is heated in an oxygen-containing atmosphere. In this way, at least the end 120 of the HfC single crystal 110, through which electrons are to be emitted, is oxidized and coated with hafnium oxycarbide 130 ($HfC_{1-x}O_x$: $0<x\leq0.5$, FIGS. 1 and 2). In addition, since the end 120 of the HfC single crystal 110, through which electrons are to be emitted, has a tapered shape, the oxidation of the end 120 can be more efficiently advanced.

In step S320, the oxygen partial pressure is preferably in the range of $1\times10^{-8}$ Pa or more and $1\times10^{-5}$ Pa or less. If the oxygen partial pressure is less than $1\times10^{-8}$ Pa, the end 120 of the HfC single crystal 110, through which electrons are to be emitted, may not be oxidized, and the hafnium oxycarbide 130 may not be formed. If the oxygen partial pressure exceeds $1\times10^{-5}$ Pa, the oxidation of the end 120 may excessively proceed, and hafnium carbon monoxide ($HfC_yO_{1-y}$: $0<y\leq0.5$) or hafnium oxide ($HfO_2$) may be formed. Further, the film thickness of the hafnium oxycarbide 130 may exceed 20 nm, and electron emission characteristics may be deteriorated. More preferably, the oxygen partial pressure is in the range of $5\times10^{-7}$ Pa or more and $7\times10^{-6}$ Pa or less. Within this range, the oxidation of the end 120 of the HfC single crystal 110 is promoted, and the end 120 of the HfC single crystal 110 can be coated with the hafnium oxycarbide 130 in a shorter time by appropriately adjusting the heating temperature.

In step S320, the heating temperature is preferably in the range of 400 K or more and 1200 K or less. If the heating temperature is less than 400 K, the end 120 of the HfC single crystal 110, through which electrons are to be emitted, may not be oxidized, and the hafnium oxycarbide 130 may not be formed. If the heating temperature exceeds 1200 K, the oxidation of the end 120 may excessively proceed, and hafnium carbon monoxide ($HfC_yO_{1-y}$: $0<y\leq0.5$) or hafnium oxide ($HfO_2$) may be formed. In addition, the hafnium oxycarbide 130 having good quality may not be formed, and the electron emission characteristics may be deteriorated. More preferably, the heating temperature is in the range of 900 K or more and 1100 K or less. Within this range, the oxidation of the end 120 of the HfC single crystal 110 is promoted, and the end 120 of the HfC single crystal 110 can be coated with the hafnium oxycarbide 130 in a shorter time by appropriately adjusting the oxygen partial pressure. Accordingly, the hafnium oxycarbide 130 having good quality can be obtained.

In step S320, preferably, the heating time is in the range of 5 seconds or more and 600 seconds or less. If the heating temperature is less than 5 seconds, the end 120 of the HfC single crystal 110, through which electrons are to be emitted, may not be oxidized, and the hafnium oxycarbide 130 may not be formed. If the heating time exceeds 600 seconds, the oxidation of the end 120 may excessively proceed, and hafnium carbon monoxide ($HfC_yO_{1-y}$: $0<y\leq0.5$) or hafnium oxide ($HfO_2$) may be formed. Further, the hafnium oxycarbide 130 having good quality may not be formed, and the film thickness of the hafnium oxycarbide 130 may exceed 20 nm, whereby the electron emission characteristics may be deteriorated. Preferably, the heating time is in the range of 5 seconds or more and 350 seconds or less. Further, the heating time is still more preferably in the range of 10 seconds or more and 300 seconds or less. Within the above range, the hafnium oxycarbide 130 having a thickness in the range of 1 nm or more and 20 nm or less can be easily obtained by appropriately adjusting the oxygen partial pressure and the heating temperature.

Satisfying the above-described oxygen partial pressure, heating temperature, and heating time in step S320 is preferable, because the hafnium oxycarbide 130 having a thickness in the range of 1 nm or more and 20 nm or less is formed.

Note that a flushing step may be performed after step S310 and before step S320 described above. By flushing, carbon (C) on the surface of the HfC single crystal 110 (typically, the surface is terminated with stable C) can be removed and terminated with hafnium (Hf). When step S320 is performed after the flushing step, the end 120 of the HfC single crystal 110 can be reliably oxidized and coated with the hafnium oxycarbide 130 due to instability of the terminated Hf. Note that, the flushing step is similar to the normal flushing treatment, but for example, the HfC single crystal may be connected to a power supply for flushing and energized and heated.

In addition, step S320 may be performed immediately after step S310 (immediately after the flushing step when the flushing step is performed), may be performed after the nanowire 100 is attached to the needle, the filament, or the like subsequent to step S310, or may be performed in the process of manufacturing an electron gun including the emitter.

Embodiment 2

In Embodiment 2, an electron gun including the emitter according to the present invention will be described.

FIG. 4 is a schematic view showing the electron gun according to the present embodiment.

An electron gun 400 according to the present embodiment includes at least an emitter 410 including the nanowire 100 described in Embodiment 1. In FIG. 4, the emitter 410 further includes a filament 420 and a needle 430 in addition to the nanowire 100.

The nanowire 100 is attached to the filament 420 via the needle 430. The needle 430 is made of an element selected from the group consisting of tungsten (W), tantalum (Ta), platinum (Pt), rhenium (Re), and carbon (C). This is preferable because handling of the nanowire 100 is simplified. In addition, the nanowire 100 is attached to the needle 430 with a conductive adhesive sheet such as a carbon pad. In FIG. 4, the filament 420 has a hairpin-type shape (U-shape), but is not limited thereto, and the shape of the filament 420 may be any shape such as a V-shape.

In the electron gun 400, an extraction power supply 450 is connected between an electrode 440 and an extraction electrode 460, and the extraction power supply 450 applies a voltage between the emitter 410 and the extraction electrode 460. In the electron gun 400, an acceleration power supply 470 is further connected between the electrode 440 and an acceleration electrode 480, and the acceleration power supply 470 applies a voltage between the emitter 410 and the acceleration electrode 480.

The electrode 440 may further be connected to a flash power supply in a case where the electron gun 400 is a cold cathode field emission electron gun, or may be connected to a heating power supply in a case where the electron gun 400 is a Schottky electron gun.

The electron gun 400 may be disposed under a vacuum of $10^{-8}$ Pa to $10^{-7}$ Pa (in the range of $10^{-8}$ Pa or more and $10^{-7}$ Pa or less), and in this case, an end of the emitter 410, through which electrons are to be emitted, can be kept clean.

An operation in a case where the electron gun 400 according to the present embodiment is a cold cathode field emission electron gun will be briefly described.

The extraction power supply 450 applies a voltage between the emitter 410 and the extraction electrode 460. In this way, electric field concentration is generated at the end of the nanowire 100 of the emitter 410, through which electrons are to be emitted, and electrons are extracted. Further, the acceleration power supply 470 applies a voltage between the emitter 410 and the acceleration electrode 480. In this way, the electrons extracted at the end of the nanowire 100 of the emitter 410, through which the electrons are to be emitted, are accelerated and emitted toward a sample. The surface of the nanowire 100 may be cleaned by, if needed, performing flushing using a flash power supply connected to the electrode 440. These operations are performed under the above-described vacuum.

An operation in a case where the electron gun 400 according to the present embodiment is a Schottky electron gun will be briefly described.

A heating power supply connected to the electrode 440 heats the emitter 410, and the extraction power supply 450 applies a voltage between the emitter 410 and the extraction electrode 460. In this way, Schottky emission is generated at the end of the nanowire 100 of the emitter 410, through which the electrons are to be emitted, and electrons are extracted. Further, the acceleration power supply 470 applies a voltage between the emitter 410 and the acceleration electrode 480. In this way, the electrons extracted at the end of the nanowire 100 of the emitter 410, through which the electrons are to be emitted, are accelerated and emitted toward the sample. These operations are performed under the above-described vacuum. Since thermoelectrons can be emitted from the nanowire 100 of the emitter 410 by the heating power supply, the electron gun 400 may further include a suppressor (not shown) for shielding the thermoelectrons.

Since the electron gun 400 according to the present embodiment includes the emitter 410 including the nanowire 100 described in Embodiment 1, electrons can be easily emitted, and electrons can be stably emitted for a long time. Such electron gun 400 is employed in any electronic device having an electron focusing capability. Such an electronic device is, for example, selected from the group consisting of a scanning electron microscope, a transmission electron microscope, a scanning transmission electron microscope, an Auger electron spectrometer, an electron energy loss spectrometer, and an energy dispersive electron spectrometer.

Next, the present invention will be described in detail with reference to specific examples, but it should be noted that the present invention is not limited to these examples.

EXAMPLES

Example 1

In Example 1, using a nanowire made of an HfC single crystal, an end of the nanowire, through which electrons are to be emitted, was coated with hafnium oxycarbide (HfC$_{1-x}$O$_x$: 0<x≤0.5), whereby an emitter was manufactured.

A nanowire made of an HfC single crystal was manufactured by a CVD method in accordance with the same procedure and conditions as in Reference Example 1 of Patent Literature 1. From the obtained assembly of nanowires, a nanowire having a <100> crystal direction (hereinafter, such nanowire is simply referred to as the <100> nanowire) in the growth direction (longitudinal direction) was chosen and used, and the emitter was manufactured. The length of the <100> nanowire in the lateral direction used in Example 1 and the later-described examples and comparative examples was mostly in the range of 50 nm to 100 nm, and the length in the longitudinal direction was mostly 10 μm to 20 μm.

Figure 5:
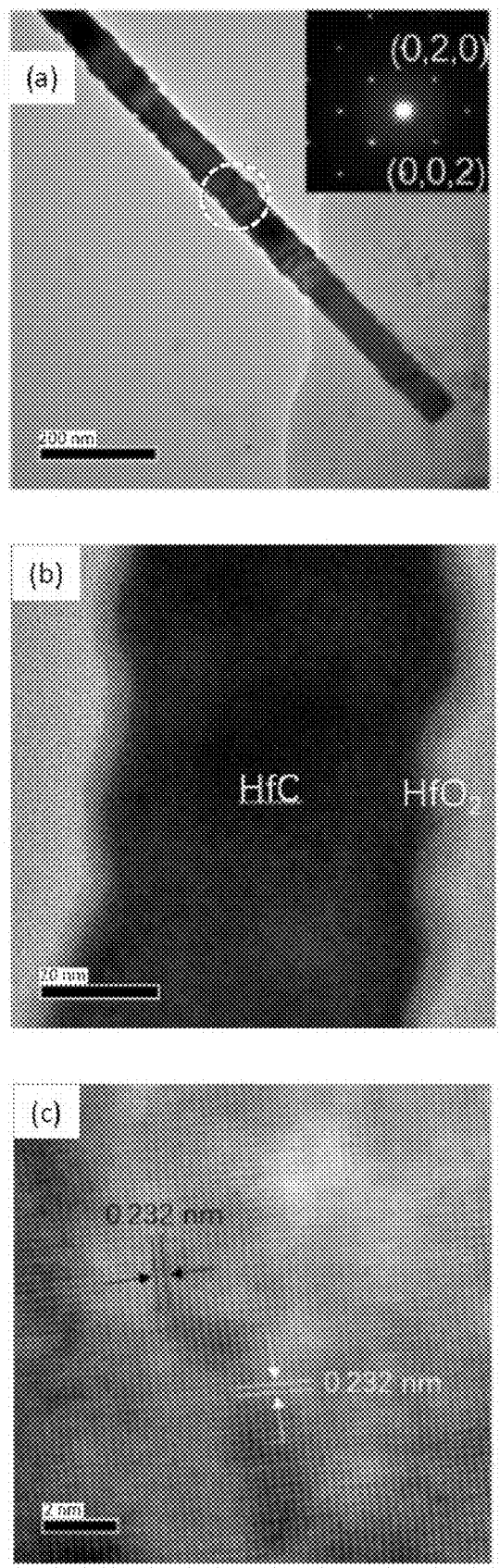
FIG. 5 shows representative TEM images of nanowires used in examples and comparative examples: (a) a low-magnification TEM image, (b) a TEM image obtained by enlarging a portion circled by a white dotted line in (a), and (c) an HRTEM image.

FIGS. 5(a) to 5(c) are representative transmission electron microscope (TEM) images of the nanowires used. The scale bars in FIGS. 5(a), 5(b), and 5(c) are 200 nm, 20 nm, and 2 nm, respectively.

According to the low-magnification TEM image shown in FIG. 5(a), the length of the nanowire in the lateral direction in FIG. 5(a) was 50 nm to 60 nm. In addition, the nanowire was found to be a single crystal having a <100> crystal direction from the selected area electron diffraction pattern (SAED) inserted in the upper right of FIG. 5(a).

FIG. 5(b) is an enlarged TEM image of a portion circled by a white dotted line in FIG. 5(a). According to FIG. 5(b), it was found that the nanowire had a body made of HfC (dark color portion at the center), and an oxide coating (HfO$_2$) layer (thickness: about 5 nm) was present around the body (at the surface of the nanowire).

Also from a high-resolution transmission electron microscope (HRTEM) image shown in FIG. 5(c), it was confirmed that the nanowire was a single crystal, and the growth direction thereof coincided with <100>.

The procedure of manufacturing the emitter was as follows. A commercially available emitter made of tungsten (W) having a <310> crystal direction was etched and processed into a tapered shape at one end. The tapered end was then cut and processed using a focused ion beam (FIB) system whereby a flat platform was formed. The <100> nanowire was placed on the flat platform and fixed using a carbon pad by electron beam induced deposition (EBID). Note that, as the support (substrate) for fixing the nanowire, tantalum (Ta), molybdenum (Mo), and other metals can be used in addition to tungsten.

Next, the nanowire was subjected to field evaporation using a field ion microscope (FIM) in atmospheric gas for 18 hours (step S310 in FIG. 3).

The state of the end of the nanowire before and after field evaporation was observed with a scanning electron microscope (SEM), a field ion microscope (FIM), and a field emission microscope (FEM). These results are given in FIGS. 6(a) to 6(f).

FIG. 6(a) is an SEM image of the end of the nanowire before field evaporation, FIG. 6(b) is an FIM image of the end of the nanowire before field evaporation, and FIG. 6(c) is an FEM image of the end of the nanowire before field evaporation. FIG. 6(d) is an SEM image of the end of the nanowire after field evaporation, FIG. 6(e) is an FIM image of the end of the nanowire after field evaporation, and FIG. 6(f) is an FEM image of the end of the nanowire after field evaporation.

From the SEM image of FIG. 6(a), the length d of the end of the nanowire in the lateral direction before field evaporation was 80 nm. In addition, from the FIM image of FIG. 6(b), a tip of the end of the nanowire before field evaporation was found to have a facet having a Miller index {100} in a center portion and a facet having a Miller index {111} in a peripheral portion. Incidentally, four facets having a Miller index {111} were confirmed in FIG. 6(b), suggesting that the section of the nanowire is rectangular. In addition, from the FEM image of FIG. 6(c), variations were observed in the FEM pattern at the end of the nanowire before field evaporation.

On the other hand, from the SEM image of FIG. 6(d), it was confirmed that the end of the nanowire after field evaporation had a tapered shape, and a radius of curvature r of the tip was 25 nm, which was a value of 31.25% of the length d of the end of the nanowire in the lateral direction (80 nm). In addition, from the FIM image of FIG. 6(e), it was found that bright portions were concentrated on the tip of the end of the nanowire having the tapered shape, and in the tip, the facets each having the Miller index {111}, which had been present before the field evaporation, disappeared, and the facet having the Miller index {100} was present. From the FEM image of FIG. 6(f), the field electron emission pattern at the end of the nanowire after field evaporation was a single spot.

Additionally, when the state of the end of the nanowire during the field evaporation was tracked and observed by an FIM, a state in which the FIM pattern was gathered at the tip (center portion) of the end of the nanowire as time elapsed was able to be confirmed (not shown).

From these results, it has been confirmed that the end of the nanowire has a tapered shape due to the field evaporation step, and the radius of curvature r of the tip of the end can be set to a value of 50% or less of the length of the nanowire in the lateral direction (i.e., the diameter of the nanowire).

Next, the tip of the nanowire after field evaporation was flushed, thereafter oxygen was introduced into the chamber and the nanowire was heated in an oxygen-containing atmosphere (step S320 in FIG. 3). Describing in detail, the oxygen partial pressure in the chamber was set to $7 \times 10^{-6}$ Pa, and the nanowire was heated at 1000 K for 120 seconds.

The state of the end of the nanowire after heating was analyzed by a TEM. The results are given in FIGS. 7(a) to 7(f).

FIG. 7(a) is a scanning transmission electron microscope (STEM) image of the end of the nanowire.

It was found from the STEM image of FIG. 7(a) that the end of the nanowire had a tapered shape, and the radius of curvature of the tip was about 25 nm.

FIGS. 7(b) to 7(e) are images showing results of mapping using STEM-EDS in which energy dispersive X-ray spectroscopy (EDS) is combined with a STEM.

FIG. 7(f) is a diagram showing the result of STEM-EELS in which electron energy-loss spectroscopy (EELS) is combined with a STEM.

It was confirmed from FIGS. 7(b) to 7(d) that carbon (C), oxygen (O), and hafnium (Hf) elements were present on the surface of the nanowire (FIGS. 7(b), 7(c), and 7(d), respectively). In addition, it was confirmed from FIG. 7(e) that the distribution of C and Hf increased from the surface to the inside of the nanowire, and the distribution of O was large at the surface of the nanowire and small at the inside. Also from the result of FIG. 7(f), the end of the nanowire (HfC single crystal) was found to contain both carbon and oxygen.

From these results, a portion including the end of the nanowire (HfC single crystal) was found to be coated with hafnium oxycarbide ($HfC_xO_y$).

Next, the field emission current of the emitter thus obtained was measured at room temperature and an extraction voltage of 362 V to 390 V using a field ion microscope (FIM). The results are given in FIGS. 8(a) and 8(b).

FIGS. 8(a) and 8(b) are graphs indicating field emission characteristics of the emitter according to Example 1. FIG. 8(a) is a graph of the field emission current obtained by changing the extraction voltage from 362 V to 390 V in increments of 1 V (a graph indicating V-I characteristic), and FIG. 8(b) is an F-N plot (horizontal axis: reciprocal of applied voltage (1/V), vertical axis: value obtained by taking the natural logarithm of value obtained by dividing emission current by square of extraction voltage ($Ln(I/V^2)$)) obtained from the result of FIG. 8(a).

From the results of FIGS. 8(a) and 8(b), the emitter according to Example 1 was found to have stable field electron emission characteristics. In addition, the work function (p of the end (portion emitting electrons) of the nanowire constituting the emitter according to Example 1 was calculated to be 2.47 eV. This value is much smaller than the work function value of HfC nanowires having a <100> crystal direction (3.6 eV) reported so far (W. A. Mackie et al., Field emission from hafnium carbide, J. Vac. Sci. Tech. A 10, 2852-2856 (1992)), indicating that the emitter according to the present invention has excellent electron emission characteristics.

Next, the current stability of the emitter according to Example 1 was confirmed. The results are given in FIGS. 9(a) to 9(c).

Figure 9:
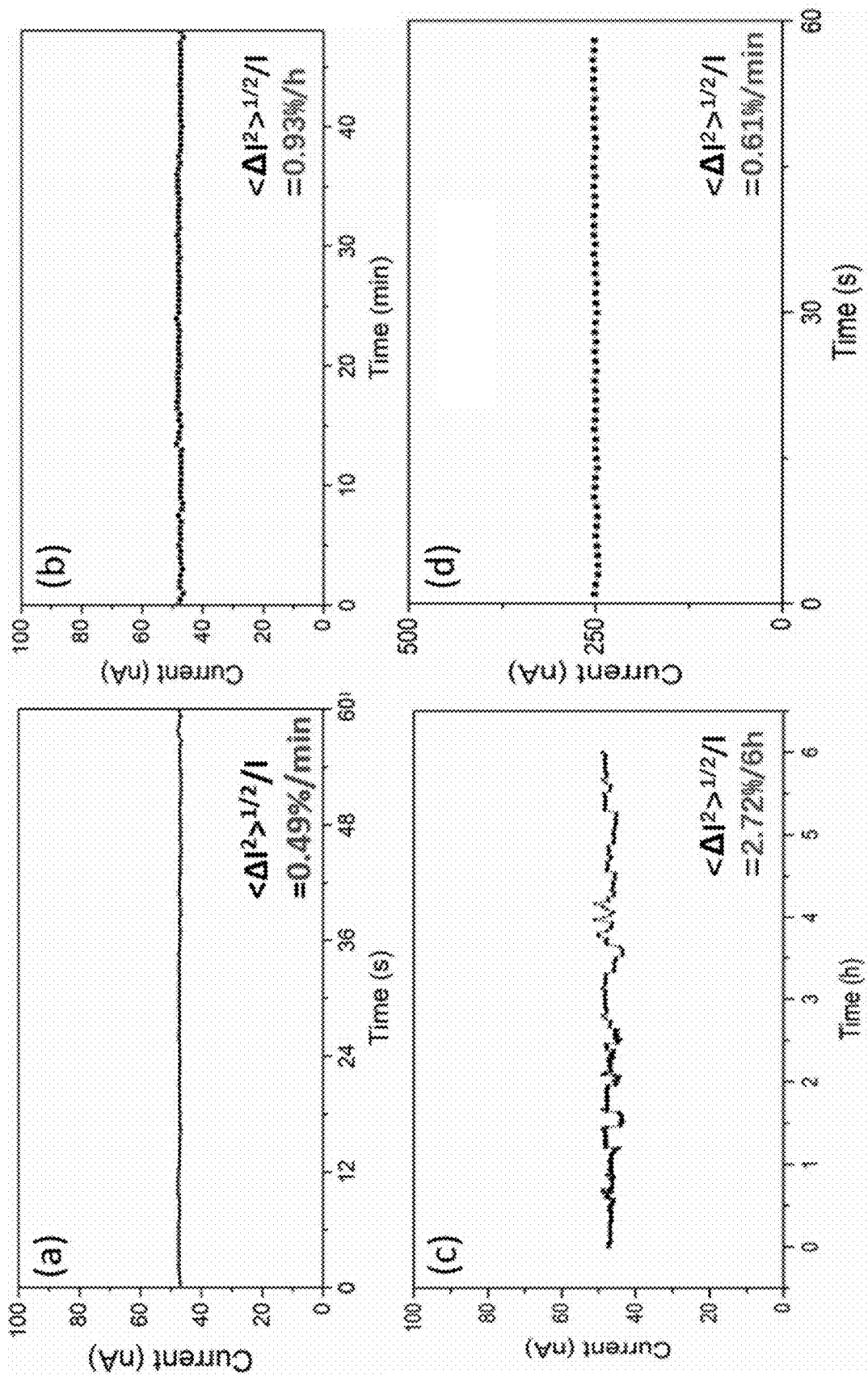
FIG. 9 shows current stability of emitters of the examples: (a) to (c), graphs indicating current stability at a current value of 46.7 nA (applied voltage is 417 V) for 1 minute, 1 hour, and 6 hours for the emitter according to Example 1; and (d) a graph indicating current stability at a current value of 250 nA (applied voltage is 938 V) for 1 minute for an emitter according to Example 2.

FIGS. 9(a) to 9(c) are graphs respectively indicating current stability for 1 minute, 1 hour, and 6 hours at a standard current value (46.7 nA, applied voltage: 417 V) as a field emission electron source for the emitter according to Example 1.

As a result of evaluating the fluctuation of the emission current from the results of FIGS. 9(a) to 9(c), the values of $<\Delta I^2>^{1/2}/I$ were 0.49%/min, 0.93%/h, and 2.72%/6 h, respectively, and in all cases, significantly lower values were obtained as compared with the case of using the commercially available tungsten chip having a <310> crystal direction (not shown). This indicates that the emitter according to the present invention has excellent properties as a field emission electron source in any of the short term, the middle term, and the long term.

Next, current stability at a higher current value was verified using an emitter manufactured by coating a nanowire with hafnium oxycarbide ($HfC_{1-x}O_x$: $0<x\leq0.5$), in which the radius of curvature r of the tip of the end of the nanowire was 50 nm, in accordance with the same procedure as in Example 1 (hereinafter, such emitter is referred to as the emitter according to Example 2). Note that, in the emitter according to Example 2, it has been confirmed that the length d of the end of the <100> nanowire in the lateral direction before field evaporation exceeds 100 nm, the end of the nanowire has a tapered shape due to the field evaporation step, and the radius of curvature r of the tip of the end is a value of 50% or less of the length of the nanowire in the lateral direction (i.e., the diameter of the nanowire).

FIG. 9(d) is a graph indicating current stability for 1 minute at a current value of 250 nA (applied voltage: 938 V) for the emitter according to Example 2.

As a result of evaluating the fluctuation of the emission current from the result of FIG. 9(d), the value of $<\Delta I^2>^{1/2}/I$ was 0.61%/min. The brightness of electrons (electron beam) emitted from the emitter according to Example 2 was $2.142 \times 10^{11}$ ($A/m^2/sr/V$). This suggests that the emitter according to the present invention has both stability at a high current value and high brightness as a field emission electron source.

Next, the relationship between energy spreads and reduced brightness of the electrons (electron beams) emitted from the following emitters was analyzed. The emitters used in this analysis are: the emitters according to Examples 1 and 2; an emitter prepared using the <100> nanowire having the radius of curvature r of the tip of the end of 30 nm (hereinafter, this emitter is referred to as the emitter according to Example 3); and two kinds of emitters prepared using the <100> nanowire having the radius of curvature r of the tip of the end of 25 nm (hereinafter, these emitters are referred to as the emitter according to Example 4 and the emitter according to Example 5), similarly to Example 1.

FIG. 10(a) is a graph indicating an energy spread of electrons emitted from the emitter according to Example 1 (in the graph, denoted by "HfC") and an energy spread of electrons emitted from an emitter using a commercially available tungsten chip having a <310> crystal direction (in the drawing, denoted by "W").

In FIG. 10(a), a current density in the emitter according to Example 1 was $1.159 \times 10^{11}$ (A/m$^2$), and a current density in the emitter using the tungsten chip having a <310> crystal direction was $3.590 \times 10^9$ (A/m$^2$), and the energy spread values obtained from the result of FIG. 10(a) were 0.228 eV (HfC) and 0.380 eV (W), respectively. From this result, it was confirmed that the energy spread of electrons (electron beam) emitted from the emitter according to the present invention was much narrower than that emitted from an emitter using a conventional tungsten chip having a <310> crystal direction.

FIG. 10(b) is a diagram showing the relationship between energy spreads (x-axis, unit: eV) and reduced brightness (y-axis, unit: A/m$^2$/sr/V) obtained at three different current values for the emitter according to Example 1.

The values of the three plots indicated in FIG. 10(b) were as follows in the ascending order of the value of the x-axis (energy spread): (x, y)=(0.225, $2.89 \times 10^{11}$), (x, y)=(0.232, $3.14 \times 10^{11}$), and (x, y)=(0.235, $3.18 \times 10^{11}$). In other words, the energy spread was in the range of 0.225 to 0.235 eV, and the reduced brightness in the range of $2.89 \times 10^{11}$ to $3.18 \times 10^{11}$ (A/m$^2$/sr/V) was obtained, in the emitter according to Example 1. Although not shown in FIG. 10(b), by including the results for the emitters according to Examples 2 to 5, the energy spread was in the range of 0.210 to 0.260 eV, and the reduced brightness in the range of $1.95 \times 10^{11}$ to $3.81 \times 10^{11}$ (A/m$^2$/sr/V) was obtained.

On the other hand, in a case of an emitter using a commercially available tungsten chip having a <310> crystal direction, the energy spread was in the range of about 0.33 to 0.48 eV, and the reduced brightness was in the range of $6.0 \times 10^7$ to $4.4 \times 10^9$ (A/m$^2$/sr/V) (not shown). From these results, the emitter according to the present invention was found to be able to emit electrons with a narrow energy spread and high brightness.

Comparative Example 1

In Comparative Example 1, the emitter was manufactured by fixing a <100> nanowire to tungsten (W) having a <310> crystal direction processed into a tapered shape, using a carbon pad by the same material and manufacturing procedure as in Example 1.

For the emitter according to Comparative Example 1 thus obtained, the time dependence of the field emission current at room temperature and an extraction voltage of 820 V was measured. The result is given in FIG. 11.

Figure 11:
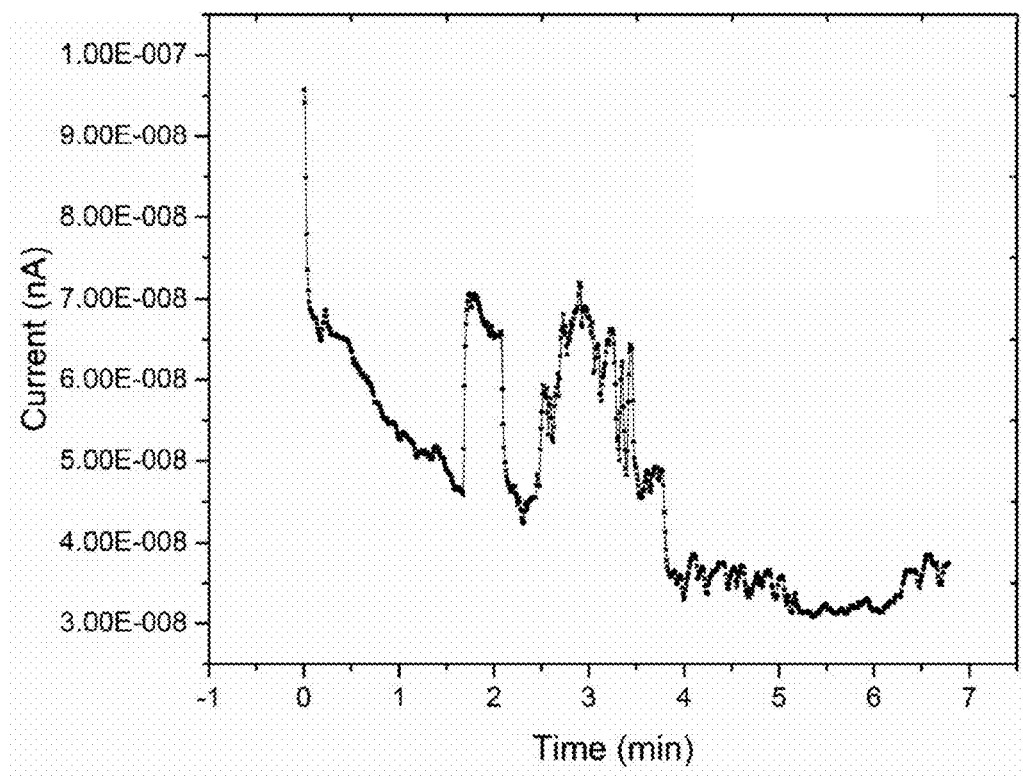
FIG. 11 is a graph indicating the time dependence of the field emission current of the emitter according to Comparative Example 1.

FIG. 11 is a graph indicating the time dependence of the field emission current of the emitter according to Comparative Example 1.

As shown in FIG. 11, in the emitter according to Comparative Example 1, a field emission current having a very small value (about 96 nA) was exhibited by the application of the electric field, and then the current value sharply decreased. In addition, after the current value further decreased up to about 1.5 minutes after the application of the electric field, an unstable behavior was exhibited, and after about 4 minutes, the current value shifted in the range of 30 to 40 nA. Accordingly, the measurement was discontinued 7 minutes after the application of the electric field.

In the emitter according to Comparative Example 1, no measurable field emission current value was obtained under the conditions of room temperature and an extraction voltage of 700 V.

Comparative Example 2

In Comparative Example 2, a <100> nanowire was fixed to tungsten (W) having a <310> crystal direction and processed into a tapered shape using a carbon pad by the same material and manufacturing procedure as in Example 1.

Next, the nanowire was subjected to the field evaporation using a field ion microscope (FIM) in atmospheric gas for 18 hours (step S310 in FIG. 3), whereby an emitter was manufactured.

For the emitter according to Comparative Example 2 thus obtained, the time dependence of the field emission current at room temperature and an extraction voltage of 700 V was measured. The result is given in FIG. 12.

Figure 12:
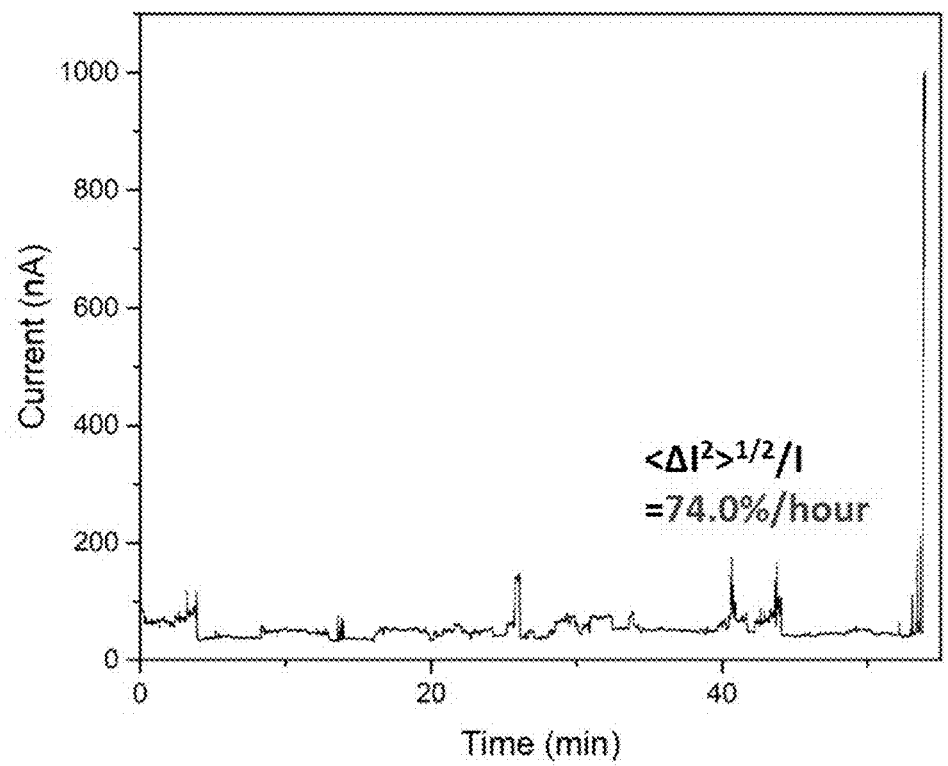
FIG. 12 is a graph indicating the time dependence of the field emission current of the emitter according to Comparative Example 2.

FIG. 12 is a graph indicating the time dependence of the field emission current of the emitter according to Comparative Example 2.

As indicated in FIG. 12, in the emitter according to Comparative Example 2, the field emission current is generated by the application of the electric field, but the current value varies with the lapse of time. As a result of evaluating the fluctuation of the emission current up to 1 hour after the measurement, $<\Delta I^2>^{1/2}/I=74.0\%/h$ was obtained, and the stability of the emission current was found to be very low. The average of the current values obtained in the measurement time of 1 hour was 54 nA.

As a theoretical consideration of the above examples and comparative examples, the electronic states of the HfC single crystal and hafnium oxycarbide (HfC$_{1-x}$O$_x$: x=0.25) were calculated on the basis of the density functional theory (DFT). The results are given in FIG. 13.

FIG. 13 is a group of graphs and diagrams showing results of calculating electronic states of the HfC single crystal and hafnium oxycarbide (HfC$_{1-x}$O$_x$: x=0.25) on the basis of the density functional theory (DFT).

As shown in the lower left molecular model of FIG. 13, the crystal structure of the HfC single crystal is a cubic system, and the relationship between the energy (eV) and the density of state (DOS) of the system is expressed as in the upper left of FIG. 13. In addition, the theoretical calculation value of the work function of the HfC single crystal was 4.09 eV.

On the other hand, when the crystal structure of hafnium oxycarbide (HfC$_{1-x}$O$_x$: x=0.25) is based on the molecular model of the HfC single crystal (lower left of FIG. 13), as shown in the molecular model in the lower right of FIG. 13, the crystal structure of hafnium oxycarbide is represented such that a carbon atom (C) located at the center surrounded by hafnium atoms (Hf) in the first, third, and fifth planes is substituted with an oxygen atom (O). The relationship between the energy (eV) and the density of state (DOS) of this system is represented as in the upper right of FIG. 13. In addition, the theoretical calculation value of the work function of this hafnium oxycarbide was 2.92 eV, which was close to the value obtained using the above emitter according to Example 1 (2.47 eV). In addition, the difference between the work function values of the HfC single crystal and hafnium oxycarbide obtained by this theoretical calculation is 1.17 eV (4.09-2.92=1.17), and the difference between the value described in the above literature (W. A. Mackie et al.) and the value in the above emitter according to Example 1 is 1.13 eV (3.6-2.47=1.13), and both values are very close. Therefore, in the emitter according to Example 1 (further, the emitters according to Examples 2 to 5), the portion including the end of the <100> nanowire (HfC single crystal) is considered to be coated with hafnium oxycarbide ($HfC_xO_y$).

Also from the results of theoretical calculation as described above, hafnium oxycarbide was confirmed to have a lower work function than the HfC single crystal, and was found to coincide successfully with the experimental results obtained in the examples and comparative examples described above.

[Example of Manufacturing Emitters Under Different Conditions]

Next, emitters are manufactured and the states of the ends of the nanowires were confirmed according to the following manner. That is, <100> nanowires having different lengths in the lateral direction were chosen and used from an assembly of nanowires made of an HfC single crystal prepared in accordance with the same procedure and conditions as those described in Example 1, and the condition of the field evaporation step (field evaporation time; step S310 in FIG. 3) and the conditions of the heating step (oxygen partial pressure, heating temperature, and heating time; step S320 in FIG. 3) were variously changed as shown in Table 1 below. In Table 1, sample No. 1 corresponds to Example 1 described above.

In sample No. 3, an emitter in which an end of a nanowire was coated with hafnium oxycarbide ($HfC_xO_y$) was able to be manufactured under the following conditions. That is, a <100> nanowire having a length d in the lateral direction of 70 nm was subjected to field evaporation whereby an end of the nanowire was formed into a tapered shape, a radius of curvature r of the tip of the end was set to a value of 35.7% of the length in the lateral direction (25 nm), and heating was performed for 40 seconds under the condition of the oxygen partial pressure ($5\times10^{-7}$ Pa) lower than that in sample No. 1 (Example 1).

In sample No. 4, an emitter in which an end of a nanowire was coated with hafnium oxycarbide ($HfC_xO_y$) was able to be manufactured under the following conditions. That is, a <100> nanowire having a length d in the lateral direction of 150 nm was subjected to field evaporation whereby an end of the nanowire was formed into a tapered shape, a radius of curvature r of the tip of the end was set to a value of 33.3% of the length in the lateral direction (50 nm), and heating was performed for 300 seconds under the condition of the oxygen partial pressure ($5\times10^{-7}$ Pa) lower than that in sample No. 1 (Example 1).

In sample No. 6, an emitter in which an end of a nanowire was coated with hafnium oxycarbide ($HfC_xO_y$) was able to be manufactured under the following conditions. That is, a <100> nanowire having a length d in the lateral direction of 140 nm was subjected to field evaporation whereby the end of the nanowire was formed into a tapered shape, a radius of curvature r of the tip of the end was set to a value of 35.7% of the length in the lateral direction (50 nm), and heating was performed for 60 seconds under the condition of the oxygen partial pressure ($6.5\times10^{-6}$ Pa) lower than that in sample No. 1 (Example 1).

TABLE 1

| Sample | d (nm) | Field evaporation time (hour) | r (nm) | Ratio of radius of curvature r to length d in lateral direction (%) | Heating conditions | | | End surface | FEM pattern |
|---|---|---|---|---|---|---|---|---|---|
| | | | | | Oxygen partial pressure (Pa) | Temperature (K) | Time (second) | | |
| 1 | 80 | 18 | 25 | 31.25 | $7 \times 10^{-6}$ | 1000 | 120 | HfCO | single spot |
| 2 | 80 | 14 | 30 | 37.5 | $5 \times 10^{-7}$ | 1000 | 75 | HfCO | single spot |
| 3 | 70 | 16 | 25 | 35.7 | $5 \times 10^{-7}$ | 1000 | 40 | HfCO | single spot |
| 4 | 150 | 50 | 50 | 33.3 | $5 \times 10^{-7}$ | 1000 | 300 | HfCO | single spot |
| 5 | 80 | 16 | 28 | 35 | $7 \times 10^{-7}$ | 1000 | 10 | HfCO | Single spot |
| 6 | 140 | 45 | 50 | 35.7 | $6.5 \times 10^{-6}$ | 1000 | 60 | HfCO | single spot |
| 2 | 80 | 15 | 32 | 40 | $1 \times 10^{-6}$ | 1000 | 30 | HfCO | single spot |
| 8 | 100 | 14 | 55 | 55 | $6 \times 10^{-5}$ | 1000 | 90 | HfO2 | — |
| 9 | 120 | 24 | 80 | 66.7 | $6.5 \times 10^{-6}$ | 1000 | 60 | HfCO | multi-spot |
| 10 | 80 | 10 | 50 | 62.5 | $6.5 \times 10^{-6}$ | 1000 | 60 | HfCO | multi-spot |
| 11 | 77 | 18 | 26 | 33.8 | $1.46 \times 10^{-6}$ | 1000 | 1500 | HfO2 | — |
| 12 | 130 | 43 | 50 | 38.5 | $1.46 \times 10^{-6}$ | 1000 | 1500 | | — |
| 13 | 180 | 58 | 60 | 33.3 | $1 \times 10^{-6}$ | 1000 | 60 | HfCO | multi-spot |
| 14 | 200 | 72 | 80 | 40 | $7 \times 10^{-7}$ | 1000 | 60 | HfCO | multi-spot |

As shown in Table 1, in sample Nos. 2, 5, and 7, emitters in which respective ends of nanowires each were coated with hafnium oxycarbide ($HfC_xO_y$) were able to be manufactured using a <100> nanowire having a length d in the lateral direction of 80 nm, similarly to sample No. 1 (Example 1). In any of the samples, the oxygen partial pressure in the heating step is lower and the heating time therein is shorter than those in sample No. 1. In particular in sample No. 5, an emitter in which an end of a nanowire was coated with hafnium oxycarbide ($HfC_xO_y$) was able to be manufactured by heating for 10 seconds under the condition of $7\times10^{-7}$ Pa in which the oxygen partial pressure was one order of magnitude lower than that in sample No. 1.

Describing sample Nos. 2 to 7 described above from the viewpoint of the conditions of the oxygen partial pressure and the heating time in the heating step, it was possible to manufacture the emitters, in which the respective ends of the nanowires each were coated with hafnium oxycarbide ($HfC_xO_y$) by heating for 10 seconds to 300 seconds under the condition of the oxygen partial pressure ($5\times10^{-7}$ Pa to $6.5\times10^{-6}$ Pa) lower than those in sample No. 1 (Example 1).

In addition from the FEM image of each of the emitters in sample Nos. 2 to 7, the field electron emission pattern at the end of the nanowire was confirmed to be a single spot.

On the other hand, sample Nos. 8, 11, and 12 are examples in which ends of nanowires each were not coated with hafnium oxycarbide ($HfC_xO_y$), and hafnium oxide ($HfO_2$) was formed.

In sample No. 8, the oxygen partial pressure in the heating step was $6 \times 10^{-5}$ Pa, which does not satisfy the preferable range described above.

In sample Nos. 11 and 12, the heating time in the heating step was 1500 seconds, which does not satisfy the preferable range described above.

Sample No. 9 is an example in which the condition of the heating step is $6.5 \times 10^{-6}$ Pa, and the end of the nanowire was coated with hafnium oxycarbide ($HfC_xO_y$) by heating for 60 seconds, both of which are the same as that of sample No. 6. However, a radius of curvature r of the tip of the end after the field evaporation step was 80 nm, and the ratio of the radius of curvature r to a length d in the lateral direction was 66.7%, both of which do not satisfy the respective preferable ranges described above. In addition, in the FEM image of an emitter of sample No. 9, it was suggested that the field electron emission pattern at the end of the nanowire was a plurality of spots, and the performance of the emitter was inferior to that of the other samples.

Sample No. 10 was an example in which the condition of the heating step is $6.5 \times 10^{-6}$ Pa, and the end of the nanowire was coated with hafnium oxycarbide ($HfC_xO_y$) by heating for 60 seconds, both of which are the same as that of sample No. 6. However, the ratio of the radius of curvature r of the tip of the end to the length d in the lateral direction after the field evaporation step was 62.5%, which does not satisfy the preferable range described above. In addition, in the FEM image of an emitter of sample No. 10, it was suggested that the field electron emission pattern at the end of the nanowire was a plurality of spots, and the performance of the emitter was inferior to that of the other samples.

Sample No. 13 is an example in which the condition of the oxygen partial pressure in the heating step was $1 \times 10^{-6}$ Pa which is the same as that of sample No. 7, and the end of the nanowire was coated with hafnium oxycarbide ($HfC_xO_y$) by heating for 60 seconds. However, the length d of the nanowire in the lateral direction was 180 nm, and the radius of curvature r of the tip of the end after being subjected to field evaporation for 58 hours was 60 nm, all of which do not satisfy the respective preferable ranges described above. In addition, in the FEM image of an emitter of sample No. 13, it was suggested that the field electron emission pattern at the end of the nanowire was a plurality of spots, and the performance of the emitter was inferior to that of the other samples.

Sample No. 14 is an example in which the condition of the oxygen partial pressure in the heating step was $7 \times 10^{-7}$ Pa which is the same as that of sample No. 5, and the end of the nanowire was coated with hafnium oxycarbide ($HfC_xO_y$) by heating for 60 seconds. However, the length d of the nanowire in the lateral direction was 200 nm, and the radius of curvature r of the tip of the end after being subjected to field evaporation for 72 hours was 80 nm, all of which do not satisfy the respective preferable ranges described above. In addition, in the FEM image of an emitter of sample No. 14, it was suggested that the field electron emission pattern at the end of the nanowire was a plurality of spots, and the performance of the emitter was inferior to that of the other samples.

INDUSTRIAL APPLICABILITY

When the emitter according to the present invention is used, electrons can be efficiently and stably emitted, and thus the emitter according to the present invention is employed in any device having an electron focusing capability, such as a scanning electron microscope, a transmission electron microscope, a scanning transmission electron microscope, an Auger electron spectrometer, an electron energy loss spectrometer, and an energy dispersive electron spectrometer.

REFERENCE SIGNS LIST

100 Nanowire
110 Hafnium carbide (HfC) single crystal
120 End through which electrons are to be emitted
130 Hafnium oxycarbide
L Length of nanowire in longitudinal direction
d Length of nanowire in lateral direction (diameter)
r Radius of curvature of tip of end of nanowire, through which electrons are to be emitted

The invention claimed is:

1. An emitter comprising a nanowire,
wherein the nanowire is made of a hafnium carbide (HfC) single crystal,
at least an end of the nanowire, through which electrons are to be emitted, is coated with hafnium oxycarbide ($HfC_{1-x}O_x$: $0 < x \leq 0.5$), and
a field electron emission pattern of the end obtained by a field emission microscope (FEM) is a single spot.

2. The emitter according to claim 1,
wherein the end of the nanowire, through which electrons are to be emitted, has a tapered shape, and
a radius of curvature r of a tip of the end is a value of 50% or less of a length d of the nanowire in a lateral direction.

3. The emitter according to claim 1, wherein a thickness of the hafnium oxycarbide is in a range of 1 nm or more and 20 nm or less.

4. The emitter according to claim 3, wherein the thickness of the hafnium oxycarbide is in a range of 1 nm or more and 10 nm or less.

5. The emitter according to claim 4, wherein the thickness of the hafnium oxycarbide is in a range of 1 nm or more and 5 nm or less.

6. The emitter according to claim 1, wherein a longitudinal direction of the nanowire corresponds to a <100>, <110>, or <111> crystal direction of the hafnium carbide single crystal.

7. The emitter according to claim 6,
wherein the longitudinal direction of the nanowire corresponds to the <100> crystal direction of the hafnium carbide single crystal, and
the end has at least {111} and {110} planes.

8. The emitter according to claim 1, wherein a length d of the nanowire in a lateral direction is in a range of 1 nm or more and 150 nm or less, and a length L of the nanowire in a longitudinal direction is in a range of 500 nm or more and 30 μm or less.

9. An electron gun comprising at least an emitter, wherein the emitter is the emitter according to claim 1.

10. The electron gun according to claim 9,
wherein the emitter further comprises a needle and a filament, and
the nanowire is attached to the filament via the needle made of an element selected from the group consisting of tungsten (W), tantalum (Ta), platinum (Pt), rhenium (Re), and carbon (C).

11. The electron gun according to claim 9, wherein the electron gun is a cold cathode field emission electron gun or a Schottky electron gun.

12. An electronic device comprising an electron gun,
wherein the electron gun is the electron gun according to claim 9, and
the electronic device is selected from the group consisting of a scanning electron microscope, a transmission electron microscope, a scanning transmission electron microscope, an Auger electron spectrometer, an electron energy loss spectrometer, and an energy dispersive electron spectrometer.

13. A method for manufacturing the emitter according to claim 1, comprising:
subjecting a nanowire made of a hafnium carbide single crystal to field evaporation in atmospheric gas, forming an end of the nanowire, through which electrons are to be emitted, into a tapered shape, and setting a radius of curvature r of a tip of the end to a value of 50% or less of a length d of the nanowire in a lateral direction; and
heating the nanowire in an oxygen-containing atmosphere,
wherein the length d of the nanowire in the lateral direction is 150 nm or less, and
in the heating the nanowire, an oxygen partial pressure is in a range of $1\times10^{-8}$ Pa or more and $1\times10^{-5}$ Pa or less, heating temperature is in a range of 400 K or more and 1200 K or less, and heating time is in a range of 5 seconds or more and 600 seconds or less.

14. The method according to claim 13, wherein the subjecting the nanowire to field evaporation is performed in a range of 12 hours or more and 50 hours or less.

15. The method according to claim 13, wherein in the heating the nanowire, the oxygen partial pressure is in a range of $5\times10^{-7}$ Pa or more and $7\times10^{-6}$ Pa or less.

16. The method according to claim 13, wherein in the heating the nanowire, the heating temperature is in a range of 900 K or more and 1100 K or less.

17. The method according to claim 13, wherein in the heating the nanowire, the heating time is in a range of 5 seconds or more and 350 seconds or less.

18. The method according to claim 13, wherein in the subjecting the nanowire to field evaporation, the radius of curvature r is in a range of 30% or more and 40% or less of the length d of the nanowire in the lateral direction.

19. The method according to claim 13, wherein in the subjecting the nanowire to field evaporation, the radius of curvature r is in a range of 25 nm or more and 50 nm or less.

20. The method according to claim 13, wherein in the heating the nanowire, the heating time is in a range of 10 seconds or more and 300 seconds or less.

* * * * *